(12) United States Patent
Joo

(10) Patent No.: US 7,374,997 B2
(45) Date of Patent: May 20, 2008

(54) METHOD OF MANUFACTURING FLASH MEMORY DEVICE

(75) Inventor: Kwang Chul Joo, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 73 days.

(21) Appl. No.: 11/292,733

(22) Filed: Dec. 2, 2005

(65) Prior Publication Data

US 2006/0270157 A1    Nov. 30, 2006

(30) Foreign Application Priority Data

May 30, 2005   (KR) ...................... 10-2005-0045694

(51) Int. Cl.
*H01L 21/336* (2006.01)
(52) U.S. Cl. .................. 438/261; 257/E21.68
(58) Field of Classification Search ............... 438/257, 438/431, 261
See application file for complete search history.

(56) References Cited

U.S. PATENT DOCUMENTS

| | | | |
|---|---|---|---|
| 5,852,306 A * | 12/1998 | Forbes ...................... 257/315 |
| 6,051,467 A | 4/2000 | Chan et al. | |
| 6,074,917 A | 6/2000 | Chang et al. | |
| 6,218,689 B1 * | 4/2001 | Chang et al. ............... 257/288 |
| 6,245,652 B1 * | 6/2001 | Gardner et al. ............ 438/592 |
| 6,774,443 B2 * | 8/2004 | Powell et al. ............... 257/412 |
| 2005/0266637 A1 * | 12/2005 | Wang ......................... 438/257 |
| 2006/0105553 A1 * | 5/2006 | Wellhausen ................ 438/526 |
| 2007/0004118 A1 * | 1/2007 | Varghese et al. ........... 438/199 |

FOREIGN PATENT DOCUMENTS

| | | |
|---|---|---|
| JP | 05-304146 | 11/1993 |
| KR | 1020000031796 A | 6/2000 |
| KR | 1020010027680 A | 4/2001 |
| KR | 1020050003540 A | 1/2005 |
| KR | 2005-0046949 | 5/2005 |
| TW | 575959 B | 2/2004 |
| TW | 584944 B | 4/2004 |

* cited by examiner

*Primary Examiner*—W. David Coleman
(74) *Attorney, Agent, or Firm*—Townsend and Townsend and Crew LLP

(57) ABSTRACT

A method of manufacturing flash memory devices includes depositing a nitride film over a semiconductor substrate and forming an oxide film below the nitride film using an oxidization process involving an anneal process. A tunnel oxide film or an ONO2 oxide film having a thin thickness and a good film quality is formed and the operating performance of memory cells is improved.

24 Claims, 2 Drawing Sheets

METHOD OF MANUFACTURING FLASH MEMORY DEVICE

BACKGROUND OF THE INVENTION

The present invention relates generally to a method of manufacturing semiconductor memory devices and more particularly, to a method of manufacturing flash memory devices.

In general, a memory cell pattern of a flash memory device has a structure in which a semiconductor substrate 11, a tunnel oxide film 13, a floating gate 14, an ONO dielectric film 15 and a control gate 16 are sequentially laminated, as shown in FIG. 1. Recently, the tunnel oxide film 13 is not formed of only a pure silicon oxide film ($SiO_2$), but is formed to include an oxynitride layer in which nitrogen is incorporated into silicon oxide ($SiO_2$). To form the tunnel oxide film of oxynitride, a process of depositing the silicon oxide film ($SiO_2$) and a process of combining nitrogen and the silicon oxide film ($SiO_2$) are sequentially performed on the semiconductor substrate 11. Charge breakdown (Qbd), Fowler-Nordheim (F-N) stress, hot carrier injection and endurance characteristics of the tunnel oxide film formed of oxynitride are superior to those of a tunnel oxide film comprised of pure silicon oxide film ($SiO_2$).

It has been discovered that lower concentrations of nitrogen in the tunnel oxide film, tend to trap more charge at the floating gate, i.e., the threshold voltage of the memory cell is shifted. Therefore, the concentration of nitrogen in the tunnel oxide film needs to be maintained within a predetermined range. As the demand for more highly integrated semiconductor memories leads to smaller features and higher device densities on a chip, the thickness of the tunnel oxide film is reduced. As the thickness of the tunnel oxide film is reduced, the quantity of nitrogen to be incorporated into the tunnel silicon oxide film ($SiO_2$) film should be correspondingly reduced. The above issue becomes an even bigger concern when a flash memory device has an ultra fine pattern with typical dimensions of 70 nm or less. Additional issues arise at these feature dimensions because the breakdown characteristics of the tunnel oxide film are degraded by electrons that move through the tunnel oxide film, and the gate characteristics are degraded as programming and erasing operations are repeatedly performed on memory cells.

The ONO dielectric film 15 has a structure in which an ONO2 oxide film 15a, an ONO2 nitride film 15b and an ONO3 oxide film 15c are sequentially layered. The ONO dielectric film 15 has a significant influence on the electrical characteristics for the program, erase and read operations of the memory cells. The thickness of the ONO dielectric film 15, as well as the quality of each of the three layers, ONO2 oxide 15a, ONO2 nitride 15b and ONO3 oxide film 15c all have a significant influence on the operating characteristics of the memory cells. Of these, the thickness and quality of the ONO2 oxide film 15a have the greatest effect on the charge leakage and charge retention characteristics of a cell transistor. This is because the function of the ONO2 oxide film 15a is to block leakage current from electrons injected into the floating gate 14. Therefore, the ONO2 oxide film 15a should be formed to thin, yet of high quality.

The ONO2 oxide film 15a and the ONO3 oxide film 15c are generally deposited by a Chemical Vapor Deposition (CVD) method using DSC (Dichlorosilane, $SiH_2Cl_2$) or silane ($SiH_4$). The quality of an oxide film formed by CVD is, however, inferior to that of oxide films formed by a thermal dry and wet oxidization process. Therefore, to form an oxide film with a thin thickness and a good film quality, a thermal oxidization process is generally used. However it is difficult to form a thin ONO2 oxide film 15a on the floating gate 14 by means of the thermal oxidization process because the floating gate 14 is a doped polysilicon film.

Since the polysilicon film constituting the floating gate 14 has a grain structure, there are grooves at the grain boundaries on its surface, as shown in FIG. 1. When the ONO2 oxide film 15a is deposited on the floating gate 14, the ONO2 oxide film 15a becomes thicker in the neighborhood of the grain boundary grooves on the surface of the polysilicon film owing to thermodynamic driving forces. Not only does the ONO2 oxide film 15a have increased thickness, but it also has an unstable interface.

In addition, the as deposited ONO2 nitride film 15b often has a porous structure and is brittle. To improve the quality of the ONO2 nitride film 15b, a high-temperature anneal process is performed after depositing the ONO2 nitride film 15b. For this reason, to attain the required operating characteristics (charge leakage and charge retention) necessary for memory cells, a high-temperature wet anneal process for improving the film quality of the ONO dielectric film 15 is carried out for a long time under atmospheric pressure following deposition of the ONO dielectric film 15.

However, when the ONO dielectric film 15 is exposed under a high-temperature wet atmosphere for a long time, a thermally driven regrowth within ONO dielectric film 15 leads to a "punch" phenomenon in the ONO2 nitride film layer 15b. This results in changing the dielectric constant of the ONO dielectric film 15, and the read, program, and erase operational characteristics of a cell transistor are degraded.

BRIEF SUMMARY OF THE INVENTION

The present invention relates to a method of manufacturing a flash memory device in which a thin tunnel oxide film or an ONO2 oxide film having good film quality can be formed. A nitride layer is first deposited on a semiconductor substrate or a polysilicon film, and an oxide film is formed below the nitride film by an oxidization process that includes annealing. The operating performance of memory cells is thereby improved.

In one embodiment, a method of manufacturing a flash memory device includes performing a cleaning process on a surface of a semiconductor substrate in which a field region and an active region have been formed, and then depositing a nitride film on the semiconductor substrate, and then performing an oxidization using an anneal process in an $N_2O$ or NO gas atmosphere, to form a silicon oxide film layer at the interface between the nitride film and the semiconductor substrate. This results in a tunnel oxide film having a structure wherein the silicon oxide film and the nitride film are layered over one another. A gate pattern is formed on the tunnel oxide film of the active region.

DETAILED DESCRIPTION OF THE INVENTION

Figure 1:
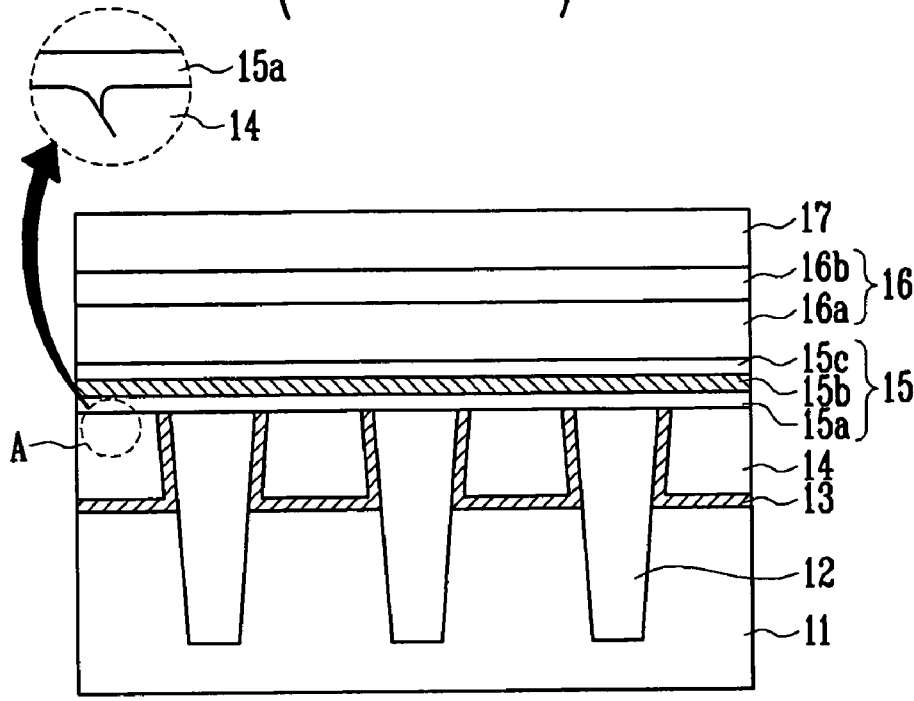
FIG. 1 is a sectional view of a part of a semiconductor substrate for illustrating a method of manufacturing a flash memory device in the related art.

The present invention will now be described in connection with preferred embodiments with reference to the accompanying drawings.

Since the preferred embodiments are provided to assist those of ordinary skill in the art to understand and practice the present invention, it will be understood that they may be modified in various ways and that the scope of the present invention is not limited by the embodiments described below.

FIGS. 2a to 2e are sectional views illustrating a method of manufacturing a flash memory device according to an embodiment of the present invention.

It should be noted that for simplicity FIGS. 2a to 2e show a portion of the device comprising an active region in which a gate pattern (i.e., a cell pattern) is formed. In FIGS. 2a to 2e, like reference numerals are used to identify the same or similar parts.

Figure 2A:
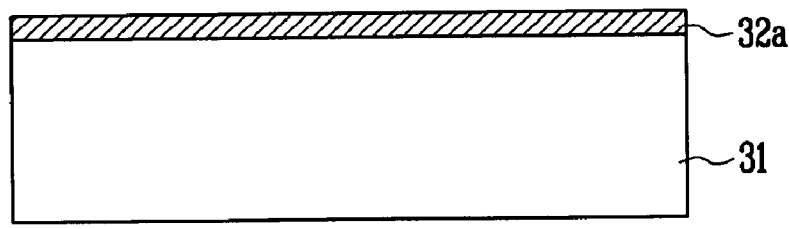
FIGS. 2a to 2e are sectional views illustrating a method of manufacturing of a flash memory device according to an embodiment of the present invention.

Referring to FIG. 2a, a cleaning process is performed on a surface of the semiconductor substrate 31 in which a field region (not shown) and an active region (not shown) are partitioned. A nitride film 32a is deposited on the cleaned semiconductor substrate 31. The cleaning process can be performed using SC-1 (a conventional solution in which an approximately 28 weight percent $NH_3$ ammonium hydroxide solution, 30 weight percent hydrogen peroxide solution and water are mixed together at a predetermined ratio of about 1:1:5), at a temperature in the range of room temperature to 80° C., and 50:1 diluted HF (a solution in which 1 part of 49% weight percent hydrofluoric acid is diluted with 50 parts water, i.e., a ratio of 1:50) or buffered oxide etchant (BOE; a mixture of approximately 6 parts by volume of 40 weight percent $NH_4F$ and 1 part by volume of 49% weight percent HF, diluted in water at a ratio of 100:1 or 300:1).

Furthermore, the nitride film 32a can be deposited by a variety of methods to be described below. The deposition of the nitride film 32a can be performed by a CVD process using a gas mixture of $SiH_4$ and $NH_3$ or a gas mixture of $SiH_2Cl_2$ and $NH_3$, at a temperature of 600° C. to 800° C. and at a pressure of 0.05 Torr to 2 Torr. Alternatively, the nitride film 32a can be deposited at relatively low temperature with a plasma using only $N_2$ or a gas mixture of $N_2$ and Ar. In addition, the nitride film 32a can be deposited by a rapid thermal treatment process using only $NH_3$, a gas mixture of $NH_3$ and Ar or a gas mixture of $NH_3$ and $N_2$ at a temperature of 600° C. to 800° C. and a pressure of 20 Torr to 760 Torr.

The nitride film 32a can be deposited at a low temperature of 300° C. or less in order to prevent surface oxidation of the semiconductor substrate 31 and can be deposited to a thickness of 20 Å to 70 Å. After a cleaning process of the semiconductor substrate 31, the nitride film 32a can be deposited on the semiconductor substrate 31 with no time delay. One reason why the nitride film 32a is deposited with no time delay is to prevent the semiconductor substrate 31 from being contaminated by atmospheric $CO_2$ or other impurities in the air since this can cause irregularities on the nitride film 32a.

Figure 2B:
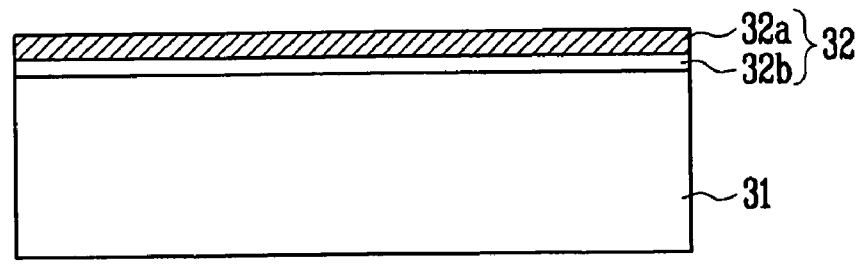

Referring to FIG. 2b, an oxidization process using an anneal process under $N_2O$ or NO gas atmosphere is performed on the semiconductor substrate 31 having the nitride film 32a deposited thereon. As a result, a silicon oxide film 32b is formed at the interface between the nitride film 32a and the semiconductor substrate 31. As a result, the tunnel oxide film 32 having the silicon oxide film 32b and the nitride film 32a layered thereon is formed on the semiconductor substrate 31.

One reason why the oxidization process is performed under $N_2O$ or NO gas atmosphere instead of using an oxidization method employing an $O_2$ gas atmosphere is that when oxidation is carried out in an $O_2$ gas atmosphere, a surface layer of the nitride film 32a is oxidized and oxygen has difficulty reaching the semiconductor substrate 31. In this case an oxide film is formed on the top surface of the nitride film 32a rather than at the interface between the nitride film 32a and the semiconductor substrate 31. Hence the film quality of the tunnel oxide film 32 formed by the oxidization in $N_2O$ or NO gas atmosphere using an anneal process is better than oxidization using a conventional wet and dry method.

The anneal process can be performed in an $N_2O$ or NO gas atmosphere with no time delay (e.g., performed in situ) after the nitride film 32a is deposited on the semiconductor substrate 31. The anneal process can be performed at a temperature of 600° C. to 1000° C. at a pressure of 500 Torr to 760 Torr. Furthermore, to lower the temperature of the anneal process, the anneal process can include a process of decomposing $N_2O$ or NO gases before they are introduced into a furnace in which the anneal process is performed by passing the $N_2O$ or NO gases through a flame reaction type torch of an oxidization apparatus or a lamp type torch.

The bonding energies of each process gas in the oxidization process can be expressed in the following table.

TABLE 1

| | Molecule | | | |
|---|---|---|---|---|
| | $N_2$ | NO | $O_2$ | $N_2O$ |
| Bonding Energy (Kcal/mol) | 225 | 150 | 117 | 57.4 |
| Bonding Energy (KJ/mol) | 950 | 633 | 494 | 242 |
| Bonding Energy (eV) | 9.85 | 6.56 | 5.12 | 2.51 |

As shown in Table, the energy which is required for $N_2O$ gas to be decomposed into $N_2$ and O is the lowest. The chemical reaction rate of $N_2O$ is the highest. Therefore if $N_2O$ gas is used in the oxidization process using the anneal process, the oxidization process can be performed at lower temperature.

The thickness of the silicon oxide film 32b formed at the interface between the nitride film 32a and the semiconductor substrate 31 can be selected within a range of 10 Å to 50 Å.

Though not shown in the drawings, after the tunnel oxide film 32 is formed, an anneal process that is performed by a wet and dry oxidization method at a temperature of 750° C. to 800° C. can be performed in order to improve the film quality of the tunnel oxide film 32 and enhance adhesion between the silicon oxide film 32b and the nitride film 32a.

Figure 2C:
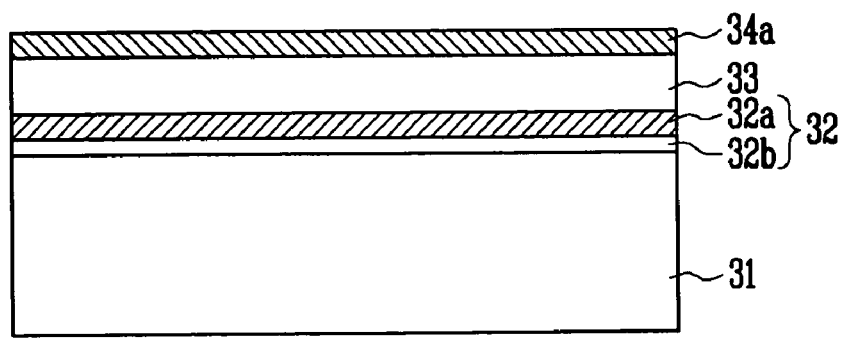

Thereafter, to form a gate pattern, a first polysilicon film 33 for a floating gate is deposited on the tunnel oxide film 32, as shown in FIG. 2c. The first polysilicon film 33 can be formed by depositing a doped polysilicon film using a dopant of P or As, and the concentration of the dopant can be in the range of $10^{20}$ to $5\times10^{21}$ cm$^{-3}$. Alternatively, the first polysilicon film 33 can be deposited by a method to be described below. In this method, an undoped polysilicon film (not shown) is first deposited on the tunnel oxide film 32 and a doped polysilicon film is deposited on the undoped polysilicon film. Thereafter, by performing a plasma thermal process in a $PH_3$ atmosphere, the undoped polysilicon film is doped by the dopant that is in the doped polysilicon film deposited thereon. In this manner the first doped polysilicon film 33 can be formed on the tunnel oxide film 32.

One reason why the undoped polysilicon film is first deposited is to prevent the dopant (e.g., P) from lowering the film quality of the tunnel oxide film 32 through infiltration into the tunnel oxide film 32 when the doped polysilicon film is directly deposited on the tunnel oxide film 32. Alternately, after the undoped polysilicon film is deposited, ripples can be formed on the surface of the undoped polysilicon film.

Meanwhile, though not shown in FIG. 2c, after the first polysilicon film 33 is deposited on the tunnel oxide film 32, a trench insulation film (not shown) can be formed in the field region. This will be described below in more detail.

A hard mask nitride film (not shown), a hard mask oxide film (not shown), an anti-reflection film (not shown) and a photoresist (not shown) are sequentially deposited on the first polysilicon film 33. After the photoresist is patterned, an etch process using the photoresist pattern as an etch mask is performed to remove the anti-reflection film and the hard mask oxide film of the field region are removed. After the photoresist pattern and the anti-reflection film are removed, an etch process using the hard mask oxide film as an etch mask is performed to etch the hard mask nitride film, the first polysilicon film 33, the tunnel oxide film 32 and the semiconductor substrate 31 of the field region. As a result, a trench (not shown) is formed in the field region.

Thereafter, the hard mask oxide film is stripped and a high density plasma (HDP) oxide film is deposited on the entire structure. A polishing process such as chemical mechanical polishing (CMP) using the hard mask nitride film as a stop layer is performed and the hard mask nitride film is removed to form a trench insulation film in the field region.

Referring to again to FIG. 2c, after the first polysilicon film 33 is deposited on the tunnel oxide film 32, a cleaning process is performed on the surface of the first polysilicon film 33. An ONO2 nitride film 34a is deposited on the first polysilicon film 33 with no time delay.

One reason why the ONO2 nitride film 34a is deposited on the first polysilicon film 33 with no time delay, as described above, is to prevent the surface of the ONO2 nitride film 34a from becoming irregular by preventing the first polysilicon film 33 from being contaminated by $CO_2$ or impurities in the air. The cleaning process is substantially the same as the cleaning process of the semiconductor substrate 31, which has already been described with reference to FIG. 2a. Hence it will not be repeated here.

Figure 2D:
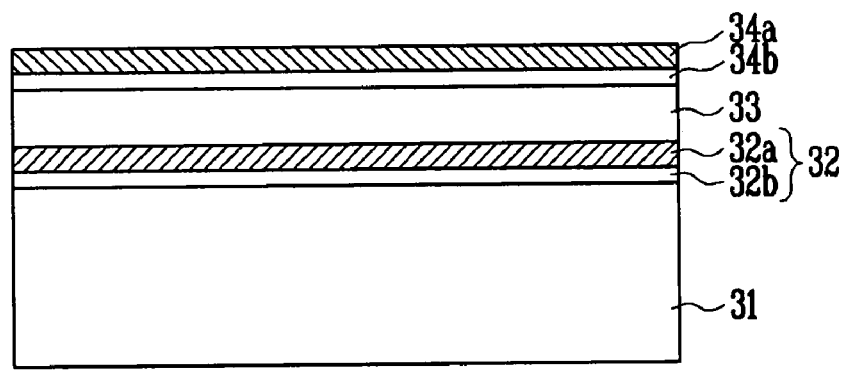

Referring to FIG. 2d, after the ONO2 nitride film 34a is deposited on the first polysilicon film 33, an anneal process is performed under $N_2O$ or NO gas atmosphere to form an ONO2 oxide film 34b at the interface between the ONO2 nitride film 34a and the first polysilicon film 33. A method and process conditions of the anneal process for forming the ONO2 oxide film 34b and a thickness range for the ONO2 oxide film 34b are substantially the same as those used for forming the tunnel oxide film 32, as already described with reference to FIG. 2b. Hence the description will not be repeated here.

Figure 2E:
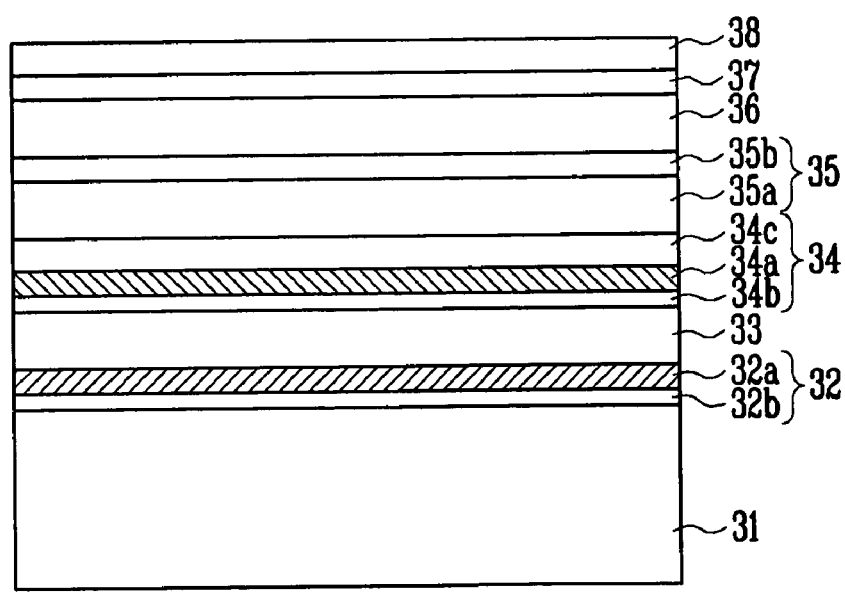

Referring to FIG. 2e, after the ONO2 oxide film 34b is formed, an ONO3 oxide film 34c is deposited on the ONO2 nitride film 34a with no time delay. Consequently, the ONO dielectric film 34 has a structure in which the ONO2 oxide film 34b, the ONO2 nitride film 34a and the ONO3 oxide film 34c are layered over the first polysilicon film (i.e., the floating gate) 33. The ONO3 oxide film 34c can be deposited by a CVD method using a gas mixture of $SiH_4$ and $N_2O$ or a gas mixture of $SiH_2Cl_2$ and $N_2O$ at a temperature of 700° C. to 900° C. and a pressure of 0.05 Torr to 2 Torr.

Furthermore, the thickness of the ONO3 oxide film 34c formed on the ONO2 nitride film 34a can be in the range of 30 Å to 100 Å.

Thereafter, the pin-hole of the ONO2 nitride film 34c is removed. To mitigate mechanical stress of the ONO2 nitride film 34c, a steam anneal process is performed. The steam anneal process can be performed by a wet oxidization method at a temperature of 750° C. to 800° C. in order to improve the film quality of the ONO dielectric film and adhesion of the ONO2 oxide film, the ONO2 nitride film and the ONO3 oxide film.

Thereafter, a second polysilicon film 35a for a control gate and a metal silicide film 35b are sequentially deposited on the ONO dielectric film 34. A doped polysilicon film can be used as the second polysilicon film 35a and $WSi_2$ can be used as the metal silicide film 35b. A hard mask film 36, an anti-reflection film 37 and a photoresist 38 are sequentially deposited on the metal silicide film 35b.

Though not shown in FIG. 2e, the photoresist 38 is patterned and an etch process using the photoresist 38 pattern as an etch mask is performed to remove the anti-reflection film and the hard mask film of the remaining regions other than a region in which the gate pattern will be formed. The photoresist 38 pattern and the anti-reflection film 37 are stripped and an etch process using the hard mask film 36 as an etch mask is performed to strip the metal silicide film 35b, the second polysilicon film 35a, the ONO dielectric film 34 and the first polysilicon film 33 of the remaining regions.

As described above, according to the present invention, a nitride film is first deposited on a semiconductor substrate or a polysilicon film and an oxide film is formed below the nitride film by an oxidization process using an anneal process. Therefore, a tunnel oxide film or an ONO2 oxide film having a thin thickness and a good film quality can be formed and the performance of memory cells can be improved.

The present invention has been described using the above specific embodiments. It should be understood that changes and modifications of the specific embodiments above may be made by the ordinary skilled in the art without departing from the spirit and scope of the present invention.

What is claimed is:

1. A method of manufacturing a flash memory device including a floating gate and control gate, comprising:

cleaning a surface of a semiconductor substrate;

depositing a nitride film on the semiconductor substrate;

performing an oxidization process involving an anneal process in a nitrogen environment to form a silicon oxide film at the interface between the nitride film and the semiconductor substrate, wherein a tunnel oxide film structure, in which the silicon oxide film and the nitride film are layered over one another, is formed over the semiconductor substrate; and forming a gate pattern over the tunnel oxide film, in which the step of forming the gate pattern comprises:

depositing a first polysilicon film over the tunnel oxide film to form the floating gate;

cleaning a surface of the first polysilicon film;

depositing an ONO2 nitride film over the first polysilicon film;

performing an oxidization process using an anneal process in a nitrogen environment to form an ONO2 oxide film at the interface between the ONO2 nitride film and the first polysilicon film;

depositing an ONO3 oxide film on the ONO2 nitride film to form an ONO dielectric film comprising the ONO2 oxide film, the ONO2 nitride film and the ONO3 oxide film.

2. The method as claimed in claim 1, wherein the step of forming the gate pattern further comprises:
   sequentially depositing a second polysilicon film for a control gate and a metal silicide film over the ONO dielectric film;
   sequentially depositing a hard mask film, an anti-reflection film and a photoresist over the metal silicide film;
   patterning the photoresist and stripping the anti-reflection film and the hard mask film of the remaining regions other than a region in which a gate pattern will be formed using the photoresist pattern as an etch mask; and
   removing the photoresist pattern and the anti-reflection film and removing the metal silicide film, the second polysilicon film, the ONO dielectric film and the first polysilicon film of the remaining regions using the hard mask film as an etch mask.

3. The method as claimed in claim 1, wherein the first polysilicon film is deposited using a dopant of P or As.

4. The method as claimed in claim 1, wherein the step of depositing the first polysilicon film comprises:
   depositing an undoped polysilicon film over the tunnel oxide film;
   depositing a doped polysilicon film over the undoped polysilicon film; and
   performing a plasma thermal process in a $PH_3$ atmosphere to dope the undoped polysilicon film.

5. The method as claimed in claim 1, wherein the cleaning-a-surface-of-the-first-polysilicon-film step is performed using SC-1 at a temperature in the range of room temperature to 80° C. and a solution selected from the group comprising 50:1 diluted HF and a buffered oxide etchant (BOE).

6. The method as claimed in claim 1, wherein the step of depositing the nitride film and the step of depositing the ONO2 nitride film are performed by a CVD process at a temperature in the range of about 600° C. to 800° C. and at a pressure in the range of about 0.05 Torr to 2 Torr using a gas composition comprising $NH_3$ and a gas selected from $SiH_4$ and $SiH_2Cl_2$.

7. The method as claimed in claim 1, wherein in the step of depositing the nitride film and the step of depositing the ONO2 nitride film, the nitride film and the ONO2 nitride film are formed using plasma generated with $N_2$ or a gas mixture including $N_2$ and Ar.

8. The method of claim 1, wherein the step of depositing the nitride film and the step of depositing the ONO2 nitride film are performed by a rapid thermal treatment process at a temperature of 600° C. to 800° C. and a pressure of 20 Torr to 760 Torr using a gas composition selected from $NH_3$, a gas mixture including $NH_3$ and Ar, and a gas mixture including $NH_3$ and $N_2$.

9. The method of claim 1, wherein the thickness of the ONO2 nitride film is 20 Å to 70 Å.

10. The method of claim 1, wherein the step of depositing the nitride film over the semiconductor substrate is performed at 300° C. or less in order to prevent surface oxidization of the semiconductor substrate and the step of depositing the ONO2 nitride film over the first polysilicon film is performed at 300° C. or less in order to prevent surface oxidization of the first polysilicon film.

11. The method as claimed in claim 1, wherein the silicon oxide film formed at the interface between the nitride film and the semiconductor substrate is 10 Å to 50 Å thick and the ONO2 oxide film formed at the interface between the ONO2 nitride film and the first polysilicon film is 10 Å to 50 Å thick.

12. The method of claim 1, wherein the anneal process includes decomposing $N_2O$ gas by passing the $N_2O$ gas through a torch before being introduced into a furnace in which the anneal process is performed to lower the temperature of the anneal process, wherein the furnace is selected from a flame reaction type torch of an oxidization apparatus and a lamp type torch.

13. The method of claim 1, wherein the anneal process includes decomposing NO gas by passing the NO gas through a torch before being introduced into a furnace in which the anneal process is performed to lower the temperature of the anneal process, wherein the furnace is selected from a flame reaction type torch of an oxidization apparatus and a lamp type torch.

14. The method of claim 1, further comprising an additional anneal process which is performed by a wet and dry oxidization method at a temperature of 750° C. to 800° C. in order to improve the film quality of the tunnel oxide film and enhance adhesion between the silicon oxide film and the nitride film after the tunnel oxide film has been formed.

15. The method as claimed in claim 1, wherein the nitrogen environment includes $N_2O$ or NO, wherein in the step of forming the ONO dielectric film, the ONO3 oxide film is formed by a CVD process using a gas mixture selected from a mixture of $SiH_4$ and $N_2O$ and a mixture of $SiH_2Cl_2$ and $N_2O$, at a temperature of 700° C. to 900° C. and a pressure of 0.05 Torr to 2 Torr.

16. The method of claim 1, wherein the thickness of the ONO3 oxide film deposited over the ONO2 nitride film is in the range of 30 Å to 100 Å.

17. The method of claim 1, wherein the nitride film is deposited over the semiconductor substrate in-situ after the cleaning the semiconductor substrate,
   wherein the ONO2 nitride film is deposited on the first polysilicon film in-situ after the cleaning e the surface of the first polysilicon film, and
   wherein the ONO3 oxide film is deposited on the ONO2 nitride film in-situ after the ONO2 oxide film is formed.

18. The method as claimed in claim 2, wherein the step of forming the gate structure further includes performing a steam anneal process in order to remove a pin-hole of the ONO2 nitride film and mitigate mechanical stress of the ONO2 nitride film,
   wherein the step of forming the gate pattern further comprises forming a trench insulation film in the field region after the step of depositing the first polysilicon film, and
   wherein the step of forming the trench insulation film comprises sequentially depositing a hard mask nitride film, a hard mask oxide film, an anti-reflection film and a photoresist over the first polysilicon film;
   patterning the photoresist and then performing an etch process using the photoresist pattern as an etch mask to remove the anti-reflection film and the hard mask oxide film of the field region;
   removing the photoresist pattern and the anti-reflection film and etching the hard mask nitride film, the first polysilicon film, the tunnel oxide film and the semiconductor substrate of the field region using the hard mask oxide film as an etch mask, thus forming a trench in the field region;

removing the hard mask oxide film and depositing a high density plasma (HDP) oxide film on the entire structure; and polishing the HDP oxide film using the hard mask nitride film as a stop layer and then removing the hard mask nitride film to form a trench insulation film in the field region.

19. The method as claimed in claim 2, wherein the second polysilicon film is a doped polysilicon film and the metal silicide film is $WSi_2$.

20. The method of claim 2, wherein the step of forming the gate structure further includes performing a steam anneal process in order to remove a pin-hole of the ONO2 nitride film and mitigate mechanical stress of the ONO2 nitride film, wherein the steam anneal process is performed in-situ at a temperature of 600° C. to 1000° C. in a nitrogen gas atmosphere.

21. The method as claimed in claim 3, wherein a dopant concentration in the first polysilicon film is in the range of $10^{20}$ to $5\times10^{21}$ $cm^{-3}$.

22. The method as claimed in claim 4, wherein the step of depositing the first polysilicon film farther includes forming ripples on a surface of the undoped polysilicon film.

23. The method of claim 18, wherein the steam anneal process is performed by a wet oxidization method at a temperature of 750° C. to 800° C. in order to improve the film quality of the ONO dielectric film and adhesion of the ONO2 oxide film, the ONO2 nitride film and the ONO3 oxide film.

24. The method as claimed in claim 20, wherein the steam anneal process is performed at a pressure of 500 Torr to 760 Torr.

* * * * *